United States Patent [19]
Jewell

[11] Patent Number: 5,822,356
[45] Date of Patent: Oct. 13, 1998

[54] INTRA-CAVITY LENS STRUCTURES FOR SEMICONDUCTOR LASERS

[75] Inventor: Jack L. Jewell, Boulder, Colo.

[73] Assignee: Picolight Incorporated, Boulder, Colo.

[21] Appl. No.: 796,111

[22] Filed: Feb. 6, 1997

[51] Int. Cl.$^6$ .................................................. H01S 3/0941
[52] U.S. Cl. ............................... 372/98; 372/46; 372/50; 257/432
[58] Field of Search ................................. 372/98, 46, 96, 372/44, 50; 257/432, 98; 359/319

[56] References Cited

U.S. PATENT DOCUMENTS

| | | | |
|---|---|---|---|
| 5,073,041 | 12/1991 | Rastani | 385/33 |
| 5,126,875 | 6/1992 | Tabuchi | 359/319 |
| 5,359,618 | 10/1994 | Lebby et al. | 372/45 |
| 5,493,577 | 2/1996 | Choquette et al. | 372/46 |
| 5,633,527 | 5/1997 | Lear | 372/44 |

OTHER PUBLICATIONS

Coldren, et al., "Dielectric Apertures as Intracavity Lenses in Vertical–Cavity Lasers," Applied Physics Letters, vol. 68, pp. 313–315 (Jan. 1996).

Hegblom, et al., "Estimation of Scattering Losses in Dielectrically Apertured Vertical Cavity Lasers," Applied Physics Letters, vol. 68, pp. 1757–1759 (Mar. 1996).

MacDougal, et al., "Electrically–Pumped Vertical–Cavity Lasers with $Al_xO_y$–GaAs Reflectors," Photonics Technology Letters, vol. 8, pp. 310–312 (Mar. 1996).

Floyd, et al., "Comparison of Optical Losses in Dielectric–Apertured Vertical–Cavity Lasers," IEEE Photonics Technology Letters, vol. 8, pp. 590–592 (May 1996).

Thibeault, et al., "Reduced Optical Scattering Loss in Vertical–Cavity Lasers Using a Thin (300 Å) Oxide Aperture," IEEE Photonics Technology Letters, vol. 8, pp. 593–595 (May 1996).

Ochiai, et al., "Kinetics of Thermal Oxidation of AlAs in Water Vapor," Applied Physics Letters, vol. 68, pp. 1898–1900 (Apr. 1996).

Choquette, et al., "Low Threshold Voltage Vertical–Cavity Lasers Fabricated by Selective Oxidation," Electronics Letters, vol. 30, pp. 2043–2044 (Nov. 1994).

Dallesasse, et al., "Hydrolization Oxidation of $Al_xGa_{1-x}As$–AlAs–GaAs Quantum Well Heterostuctures and Superlattices," Applied Physics Letters, vol. 57, pp. 2844–2846 (Oct. 1990).

Kish, et al., "Dependence on Doping Type (p/n) of the Water Vapor Oxidation of High–Gap $Al_xGa_{1-x}As$," Applied Physics Letters, vol. 60, pp. 3165–3167 (Apr. 1992).

Weigl, et al., "57% Wallplug Efficiency Wide Temperature Range 840nm Wavelength Oxide Confined GaAs VCSELs," presented as a post–deadline paper PDP2 at the International Semiconductor Laser Conference, Haifa Israel, Sep. 1996.

Hayashi, et al., "Record Low–Threshold Index–Guided InGaAs/GaAlAs Vertical–Cavity Surface–Emitting Laser with a Native Oxide Confinement Structure," Electronics Letters, vol. 31, pp. 560–562 (Mar. 1995).

Choquette, et al., "Cavity Characteristics of Selectively Oxidized Vertical–Cavity Lasers," Applied Physics Letters, vol. 66, pp. 3413–3415 (Jun. 1995).

(List continued on next page.)

*Primary Examiner*—Rodney B. Bovernick
*Assistant Examiner*—Ellen E. Kang
*Attorney, Agent, or Firm*—Jagtiani & Associates

[57] ABSTRACT

An improved lens structure is provided which reduces the scattering and/or reflection losses in an optical cavity. The lens comprising at least a first, second and third lens layer arranged vertically, the first and third lens layers being oxidized in first and third oxidized regions adjacent to first and third non-oxidized regions, the second layer disposed between the first and third layers and comprising a non-oxidized semiconductor material, the first and third non-oxidized regions comprising a semiconductor material, each of the oxidized regions having an aluminum contents greater than 20%; and appropriately spacing the first lens layer from the third lens layer to reduce the scattering and/or reflection losses in an optical cavity.

28 Claims, 8 Drawing Sheets

OTHER PUBLICATIONS

Choquette, et al., "Fabrication and Performance of Selectively Oxidized Vertical–Cavity Laser," IEEE Photonics Technology Letters, vol. 7, pp. 1237–1239 (Nov. 1995).

Deppe, et al., "Atom Diffusion and Impurity–Inducing Layer Disordering in Quantum Well III–V Semiconductor Heterostructures," Journal of Applied Physics, vol. 64, pp. 93–113 (Dec. 1988).

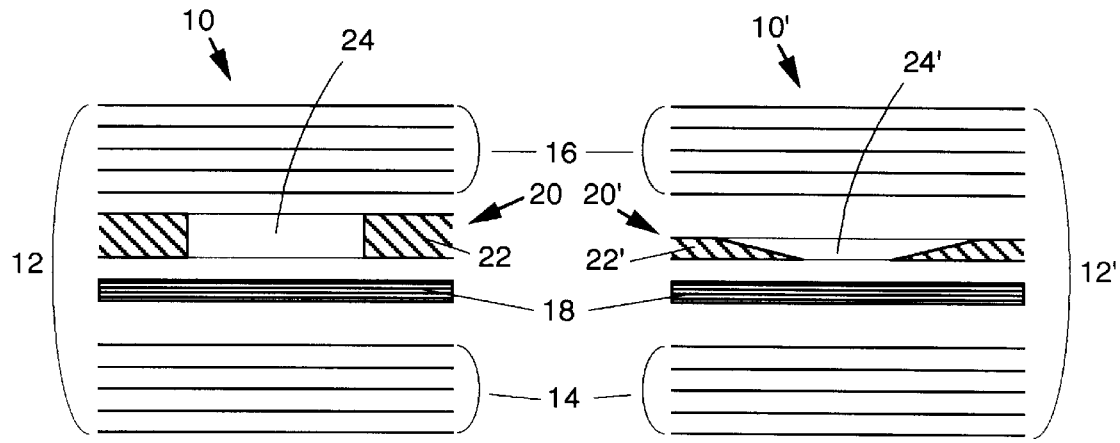
Figure 1a
(PRIOR ART)
Figure 1b
(PRIOR ART)
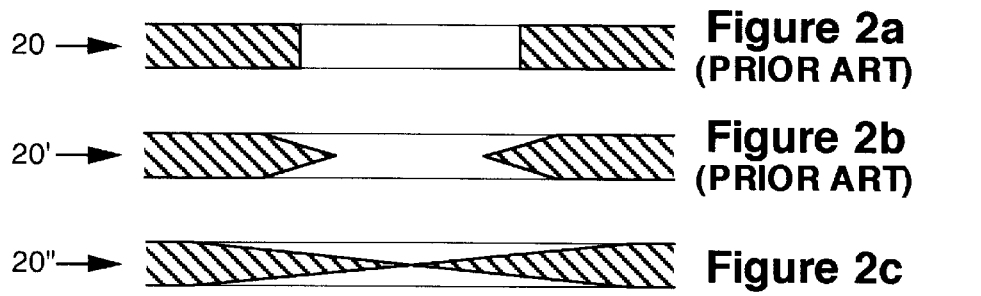
Figure 2a
(PRIOR ART)
Figure 2b
(PRIOR ART)
Figure 2c
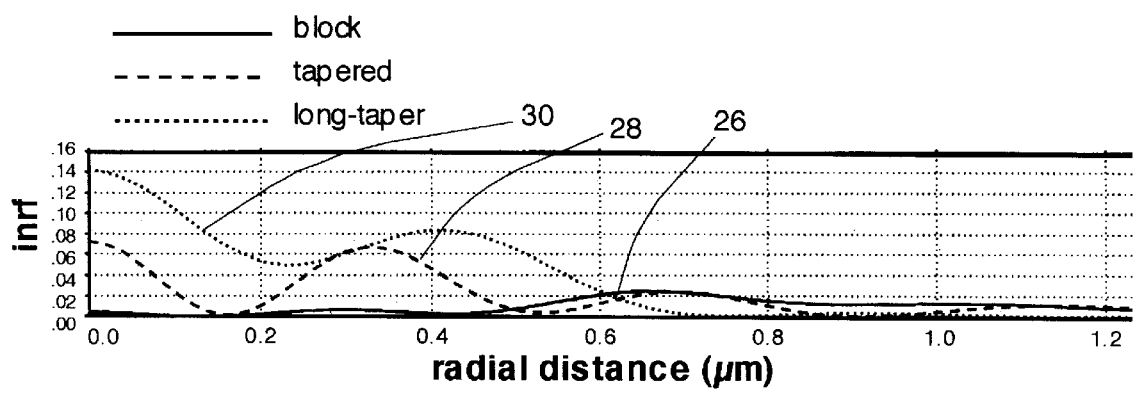
Figure 3

LENS7 - LENS3000-ANTINODE

LENS8 - LENS3000-NODE

LENS13 - LENS3000-MID

INTRA-CAVITY LENS STRUCTURES FOR SEMICONDUCTOR LASERS

This invention is made with government support under contract number DASG 60-96-C-0136, awarded by the United States Department of Defense. The government may have certain rights in this invention.

CROSS-REFERENCE TO RELATED APPLICATIONS

This application makes reference to the following co-pending U.S. patent applications. The first application is U.S. App. No. 08/547,165, entitled "Conductive Element with Lateral Oxidation Barrier," filed Dec. 18, 1995. The second application is U.S. App. No. 08/659,942, now patented with a U.S. Pat. No. 5,729,566, entitled "Light Emitting Device Having an Electrical Contact Through a Layer Containing Oxidized Material," filed Jun. 7, 1996. The third application is U.S. App. No. 08/686,489, entitled "Lens Comprising at Least One Oxidized Layer & Method of Forming Same," filed Jul. 25, 1996. The fourth application is U.S. App. No. 08/699,679, entitled "Aperture Comprising an Oxidized Region and a Semiconductor Material," filed Aug. 19, 1996. The fifth application is U.S. App. No. 08/721,769, now patented with a U.S. Pat. No. 5,719,895, entitled "Extended Wavelength Strained layer Lasers Having Short Period Superlattices," filed Sep. 25, 1996. The sixth application is U.S. App. No. 08/721,589, now allowed, entitled "Extended Wavelength Strained layer Lasers Having Strain Compensated Layers," filed Sep. 25, 1996. The seventh application is U.S. App. No. 08/721,590, now patented with a U.S. Pat. No. 5,719,894, entitled "Extended Wavelength Strained layer Lasers Having Nitrogen Disposed Therein," filed Sep. 25, 1996. The eighth application is U.S. App. No. 08/739,020, now allowed, entitled "Extended Wavelength Lasers Having a Restricted Growth Surface and Graded Lattice Mismatch," filed Oct. 28, 1996. These applications are hereby incorporated by reference.

BACKGROUND OF THE INVENTION

1. Field of the Invention

The present invention relates generally to semiconductor lasers, and more particularly to intra-cavity lens structures utilized in semiconductor lasers.

2. Description of the Prior Art

Vertical-Cavity Surface-Emitting Lasers (VCSELs), Surface Emitting Lasers (SELs) or Surface-Emitting Light Emitting Diodes (SLEDs) are becoming increasingly important for a wide variety of applications including optical interconnection of integrated circuits, optical computing systems, optical recording and readout systems, and telecommunications. Vertically emitting devices have many advantages over edge-emitting devices, including the possibility for wafer scale fabrication and testing, and the possibility of forming two-dimensional arrays of the vertically emitting devices. The circular nature of the light output beams from these devices also make them ideally suited for coupling into optical fibers as in optical interconnects or other optical systems for integrated circuits and other applications.

VCSELs or Surface Emitting Lasers SELs whose current flow is controlled by lateral oxidation processes show the best performances of any VCSELs in terms of low threshold current and high efficiency. In oxidized VCSELs the oxidation occurs in the lateral direction from the sides of etched mesas in the VCSEL wafers, typically under the conditions of 425° C. temperature with high water-vapor content. VCSELs or any other vertical light emitting devices employing laterally oxidized layers have been mostly limited only to structures which have been grown upon gallium arsenide (GaAs) substrates. For further details, see U.S. Pat. No. 5,493,577, by Choquette et al.

Generally, oxide apertures are utilized to control current flow and thus function as current apertures. The lensing aspect of an oxide aperture greatly reduces diffractive losses in VCSEL cavities and that this reduction is largely responsible for the greatly improved efficiencies. It is also known that the lens formed by a simple oxide aperture is far from ideal. Light scattered from the abrupt oxide/semiconductor interface is lost from the cavity oscillation. Similarly, optical aberrations in the lens may result in cavity losses.

Since VCSELs are presently the subject of intense research and development, a great deal of results and advancements are published frequently. The following is a summary of the prior art documents which are relevant to the problem of utilizing oxide apertures.

The oxidation rate of materials such as AlGaAs is a sensitive function of the Al concentration as described by Choquette et al. in Electronics Letters 30, pp. 2043–2044 (1994). It is therefore possible to control the extent of oxidation for multiple layers in a single process by having the layers be of different material compositions. It has also been found however, that the precise composition of a pre-oxidized layer may have a profound effect on the reliability of the oxidized structure. For example, oxidized $Al_{0.98}Ga_{0.02}As$ layers appear to be much more reliable than oxidized AlAs layers. Thus, it is preferred that all oxidizable layers in the structure have nominally the same material composition.

Variation of thickness in thin layers of oxidizable material, e.g. AlGaAs, also results in variation of the rates of lateral oxidation. This variation with thickness is described somewhat inaccurately by Dallesasse et al., in Applied Physics Letters 57, 2844–2846 (1990) as a variation with the coarseness of an AlGaAs "alloy." It was observed that the oxidation process occurred much more slowly in a fine scale alloy represented by a superlattice having 70Å thick AlAs and 30Å thick GaAs layers as compared to a coarser "alloy" comprising 150Å AlAs and 45Å GaAs layers. The variation in oxidation rate with oxidizable layer thickness (when the layers are sufficiently thin, e.g. 300Å) may be used for the creation of optical and electronic structures comprising multiple oxidized layers in which the layers oxidize at different rates and to different extents.

The lens-like behavior of oxide-defined apertures are described by Coldren et al. in "Dielectric Apertures as Intracavity Lenses in Vertical-Cavity Lasers;" Appl. Phys. Lett. 68, pp. 313–315 (Jan. 15, 1996); by Hegblom et al. in "Estimation of Scattering Losses in Dielectrically Apertured Vertical Cavity Lasers;" Appl. Phys. Lett. 68, pp. 1757–1759 (Mar. 25, 1996); by Floyd et al. in "Comparison of Optical Losses in Dielectrically-Apertured Vertical-Cavity Lasers;" Photonics Technology Letters 8, pp. 590–592 (May 1996); and by Thibeault et al. in "Reduced Optical Scattering Loss in Vertical-Cavity Lasers Using a Thin (300Å) Oxide Aperture;" Photonics Technology Letters 8, pp. 593–595 (May 1996). Only single layers are used and the publication describes the importance of minimizing the scattering at the inner boundary of the aperture. Means for minimizing the scattering are the use of a thin oxidized layer, e.g 200Å, and a tapering of the oxidation in the aperture. Tapering of the aperture has been accomplished by varying the Al concentration within the oxidizable layer, the oxidation proceeding further inward into the aperture for the portion of the layer with higher Al concentration. These references teach that tapering reduces scattering significantly.

MacDougal et al. In an article entitled "Electracally-Pumped Vertical-Cavity lasers with $Al_xO_y$ - GaAs Reflectors;" Photonics Technology Letters 8, pp. 310–312 (March 1996) describe electrically pumped VCSELs in which both mirrors are oxidized throughout their entire lateral extents and which further comprise oxide-defined current apertures above and below the active region. All the oxidized layers are a quarter-wave thick at the emission wavelength of ~9940Å. The refractive index of 1.6 for the oxidized layers implies a physical thickness >1500Å. To produce oxidized layers which are completely oxidized in the mirrors and similar oxidized layers which form apertures above and below the active region, multiple etches and oxidation processes are performed with a silicon nitride capping between the oxidation processes to prevent further oxidation of the aperture layers.

Weigel et al., in an article entitled "57% Wallplug Efficiency Wide Temperature Range 840 nm Wavelength oxide Confined GaAs VCSELs," presented as a postdeadline paper PDP2 at the International Semiconductor laser Conference, Haifa Israel, September 1996, reports record-high wall plug efficiency. The oxidized layer was 300Å thick and "shifted out of the antinode of the longitudinal standing wave pattern weakening optical scattering." This shifting also tends to weaken the effect of the lensing action.

The present inventor has also contemplated the use of oxidized layers to form a intra-cavity lens structure as may be seen in U.S. App. No. 08/686,489, entitled "Lens Comprising at Least One Oxidized Layer & Method of Forming Same," filed Jul. 25, 1996.

None of the above publications, address methods of formation of a intra-cavity lens, with the notable exception of the present inventor. The other references recognize the problems associated with scattering but fail to recognize the problems associated with reflections from the lens surfaces. Thus, these references fail to provide any teachings as to the effectiveness of particular structures as intra-cavity lenses which address the issues of reflection. Furthermore, the prior art approaches to reducing the scattering reduce the effect of the lens and/or increase the reflections. This application and U.S. App. No. 08/686,489, also by the present inventor, address particular intra-lens structures which may be effective in lasers to reduce the effects of scattering and reflection of intra-cavity lenses.

SUMMARY OF THE INVENTION

It is therefore an object of the present invention to provide an intra-cavity lens structure for a semiconductor laser which will minimize parasitic optical losses in order to minimize lasing thresholds.

It is a further object to provide an intra-cavity lens structure for a semiconductor laser which may be accomplished with simple fabrication techniques.

It is a further object to provide an intra-cavity lens structure which enhances spontaneous emission.

It is a further object to provide intra-cavity lens structures which allow control of emission wavelength via the diameter of the intra-cavity lens.

It is yet another object to provide an intra-cavity lens structure for a semiconductor laser which reduces scattering.

It is yet another object to provide an intra-cavity lens structure for a semiconductor laser which reduces reflection.

It is yet another object to provide an intra-cavity lens structure for a semiconductor laser which simultaneously reduces scattering and reflection.

In all of the above embodiments, it is an object to provide an intra-cavity lens structure for simultaneously achieving low loss, small mode size and wavelength control.

In all of the above embodiments, it is an object to provide an intra-cavity lens structure for providing extremely high efficiency as well as modulation speeds of many Gb/sec.

Finally, it is an object of the invention to provide an intra-cavity lens structure having a planar structure.

According to one broad aspect of the present invention, there is provided a lens comprising at least a first, second and third lens layer arranged vertically, the first and third lens layers being oxidized in first and third oxidized regions adjacent to first and third non-oxidized regions, the second layer disposed between the first and third layers and comprising a non-oxidized semiconductor material, the first and third non-oxidized regions comprising a semiconductor material, each of the oxidized regions having an aluminum contents greater than 20%; and means for reducing reflections from the lens.

According so another broad aspect of the present invention, there is provided a lens comprising a plurality of oxidized lens layers, each of the oxidized lens layers comprising an oxidized region adjacent to at least one respective non-oxidized region; the lens further comprising at least one non-oxidized lens layer between two of the oxidized lens layers; the lens acting upon a light beam having substantial intensity and a vacuum wavelength, wherein an optical path between centers of at least two of the oxidized layers, as measured vertically through the oxidized regions, is between one-eighth and three-eighths of the vacuum wavelength.

According to another broad aspect of the present invention, there is provided a lens comprising at least one lens layer, the lens layer comprising an oxidized region adjacent to a non-oxidized region; the lens acting upon a light beam having substantial intensity and a vacuum wavelength, the lens layer having a thickness and a refractive index of the oxidized region, a multiplicative product of the thickness and the refractive index being between three-eighths and five-eighths of the vacuum wavelength.

According to another broad aspect of the present invention, there is provided a lens comprising at least a first, second and third lens layer arranged vertically, the first and third lens layers being oxidized in first and third oxidized regions adjacent to first and third non-oxidized regions, the second layer disposed between the first and third layers and comprising a non-oxidized semiconductor material, the first and third non-oxidized regions comprising a semiconductor material, each of the oxidized regions having an aluminum contents greater than 20%; and means for reducing light scattering from the lens.

According to another broad aspect of the present invention, there is provided a lens comprising a plurality of oxidized lens layers, each of the oxidized lens layers comprising an oxidized region adjacent to at least one respective non-oxidized region; the lens further comprising at least one non-oxidized lens layer between two of the oxidized lens layers; the lens acting upon a light beam having substantial intensity and a vacuum wavelength, wherein an optical path between centers of at least two of the oxidized layers, as measured vertically through the non-oxidized regions, is between three-eighths and five-eighths of the vacuum wavelength.

According to another broad aspect of the present invention, there is provided a lens comprising a first pair of lens layers and a second pair of lens layers; the first pair of lens layers having a first and second layer arranged vertically and each layer being oxidized in a first oxidized region adjacent to at least one non-oxidized region; the second pair of lens layers having a third and fourth layer arranged vertically and each layer being oxidized in a second oxidized region adjacent to at least one non-oxidized region; a light beam having substantial intensity and a vacuum wavelength; wherein an optical path between the centers of the first and second layers, as measured vertically through the respective oxidized regions, is between one-eight and three-eighths of the vacuum wavelength; and wherein an optical path between the centers of the first and third layers, as measured vertically through the respective non-oxidized regions, is between three-eighths and five-eighths of the vacuum wavelength.

Other objects and features of the present invention will be apparent from the following detailed description of the preferred embodiment.

BRIEF DESCRIPTION OF THE DRAWINGS

The invention will be described in conjunction with the accompanying drawings, in which:

FIGS. 1a and 1b are cross-sections of prior art laser structures utilizing intra-cavity lens structures;

FIGS. 2a, 2b and 2c illustrate cross-sections of the lenses of FIG. 1a and 1b as well as an idealized lens of FIG. 1b;

FIG. 3 is a plot of reflected intensity (inrf) vs. lateral coordinate for the lenses illustrated in FIGS. 2a, 2b and 2c;

FIG. 11 is a scaled cross section for a 2X anti-reflective lens which is illustrated in FIG. 4a;

DETAILED DESCRIPTION OF THE PREFERRED EMBODIMENT

Figure 4A:
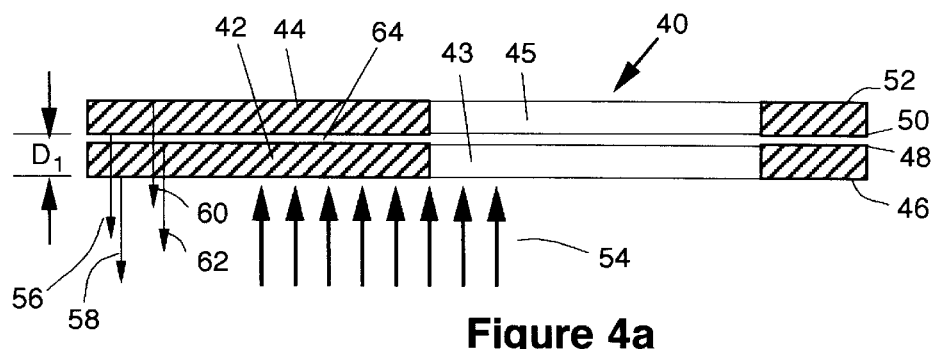
FIG. 4a is an anti-reflective lens constructed in accordance with a preferred embodiment of the invention.

With reference to the Figures, wherein like references characters indicate like elements throughout the several views and, in particular, with reference to FIG. 1, a prior art intra-cavity lens structure 10 is illustrated. Generally, these intra-cavity lens structures 10 have an optical cavity 12 which is defined, at each end, by high-reflectivity Distributed Bragg Reflectors (DBRs) 14 and 16. Disposed between DBRs 14 and 16 is an active region 18. Disposed between active region 18 and DBR 16 is a layer 20 having an oxidized region 22 surrounding an non-oxidized region 24. Layer 20 functions as a lens and non-oxidized region 24 functions as an aperture. It should be appreciated that layer 20 also functions as an aperture but that not all apertures function as lenses.

The oxidized region 22 has a refractive index of about 1.6, while the other regions of the laser typically have a refractive index around 3.0–3.5. Region 24 has a higher refractive index, hence the structure is that of a positive lens. FIG. 1a shows the standard "block" shaped lens 20. It does not look very lenslike. It is not difficult to see that this type of lens 20 suffers from imperfections such as scattering off the abrupt boundaries as well as optical aberrations.

Scattering causes optical losses in cavity 12, which decrease the cavity efficiency and raises the current threshold. In VCSEL cavities, even $\frac{1}{10}$th's of a percent losses cause significant degradation's in performance, so minimizing scattering losses is important. Furthermore, a smaller diameter lens 20 will produce more scattering. Means for minimizing the scattering include use of a thinner oxidized region 22, e.g. 200Å rather than 700Å, and a tapering of the oxidation in the aperture. Tapering of the aperture has been accomplished by varying the Al concentration within the oxidizable layer 22, the oxidation proceeding further inward into the aperture for the portion of the layer with higher Al concentration.

Turning now to FIG. 1b, a prior art tapered lens structure is illustrated. Like elements have been provided with like reference numerals except that a prime has been added to each reference numeral where there is a slight difference in the particular element in this embodiment.

As may be seen, the only substantial difference in FIG. 1b is that lens 20' is tapered to form a more "conventional" looking lens. The tapered boundaries are calculated by Coldren et al. to produce much less scattering than the block-shaped lens of FIG. 1a. Additionally, the lens of FIG. 1b is thinner than that of FIG. 1a. Thinner lenses are also calculated to have lower scattering. We have found that tapered lenses have increased problems associated with reflections as described below.

Turning now to FIG. 2a, 2b and 2c, two lens structures are illustrated as well as one idealized structure. FIG. 2a illustrates lens 20 in FIG. 2a. FIG. 2b illustrates lens 20' in FIG.

1b. FIG. 2c illustrates an idealized long taper 20". The long-taper 20" is not realistic since it reaches zero thickness exactly at the lens center, but it is useful in simulation to investigate a presumably more-ideal embodiment of the form suggested by Coldren et al.

The behaviors of the lenses of FIGS. 2a, 2b and 2c have been evaluated in which all 3 lenses have a maximum outside thickness of 2000Å. The block lens has a diameter of 0.75 µm (0.375 µm radius), and the midpoints of both tapers in the tapered lenses are located at the same radius. The reflected intensity (inrf) vs. lateral coordinate for a gaussian-profiled optical beam of radius 0.5 µm and vacuum wavelength 1.55 µm is plotted in FIG. 3 for the input plane which is 0.75 µm in front of the lenses 20, 20', and 20". Quite large reflections, 7–14%, are produced by the tapered lenses 20', 20", while the block lens 20 has much lower reflections. Curves, 26, 28 and 30 represent the reflected intensity while utilizing lenses 20, 20' and 20", respectively. Since the tapered interfaces are at oblique angles with respect to the optical axis, much of the reflected light will probably not be coupled into the lasing optical mode. This light may be considered to be in the same category as scattering losses, the same losses that the tapered lenses were designed to minimize. Furthermore, the reflected light which does stay in the lasing mode will mostly be in a different phase than the light which simply propagates through lens 20', 20". This has the effect of altering the reflectivity of the designed cavity mirrors 14,16. The occurrence of large reflections from tapered lenses 20',20" results casts serious doubt on any benefits to be gained by replacing a standard block lens 20 with a tapered lens 20',20", especially since tapered lenses 20' are more difficult to fabricate with any useful degree of control.

One method for reducing scattering which is known in the prior art is to make lens 20,20',20" thinner. A problem with making lens 20,20',20" thinner is that it produces less optical focusing power. Obviously, reducing the lens thickness to zero would reduce the scattering to zero, but it would also eliminate the huge increases in performance due to having an intra-cavity lens structure 10,10'. So the approach of thinning lens 20,20',20" has limitations and tradeoffs. Also, if the lens diameter is very small to produce a small-diameter lasing mode, diffraction effects will be much stronger. To produce a small-diameter mode, the lens power has to be higher, requiring that the lens be thicker. However, a thicker smaller-diameter lens will scatter much more light in conventional structures. Thus, there is a need to develop more sophisticated lens structures to achieve higher efficiency.

The standard prior art means for eliminating reflections is a anti-reflection coating, which typically comprises a quarter-wave-thick layer made from an appropriate refractive index. To eliminate reflections at an interface of index 3.3 and 1.6, as is typically used in a VCSEL, a layer of refractive index 2.3 is desired. Unfortunately, conventional materials having this refractive index are incompatible with the VCSEL intracavity lens structure. Furthermore, the layer thicknesses are about the same as the entire lens layer thicknesses. Therefore, a completely new form of non-reflecting layer structure is required for improved VCSEL structures.

In order to address this need, we have designed an anti-reflective lens 40 as illustrated in FIG. 4a. In a preferred embodiment, anti-reflective lens 40 comprises two layers 42,44 which are oxidized in some regions, but have non-oxidized regions 43,45, respectively. Layer 42 has first and second interfaces as illustrated by reference numerals 46 and 48, respectively. These interfaces correspond to the bottom and top faces of layer 42, respectively. Similarly, layer 44 has third and fourth interfaces as illustrated by reference numerals 50 and 52, respectively. These interfaces correspond to the bottom and top faces of layer 44, respectively. For light propagating upward, as indicated by incident light rays 54, the first and third interfaces 46 and 50 both transition from high- to low-index material and therefore both have a nominal 0° phase change on reflection. In a preferred embodiment, oxidized regions 42,44 would have an index of refraction of about n=1.6 and non-oxidized regions 43,45 would have an index of refraction of about n=2.9–3.0. An optional spacer layer 64 may be provided between layers 42 and 44. This optional spacer preferably has an index of refraction greater than either layers 42 or 44 and preferably would be n=3.3.

The key element in the design is that interfaces 46 and 50 are separated by a distance $D_1$ which is approximately one quarter wave of optical path. The optical path is defined as the summation over all layers of each layer thickness multiplied by its refractive index. If gradients in refractive index are present, the sum would be replaced by an integral. For lens 40, illustrated in FIG. 4a, the distance $D_1$ would therefore be defined by:

$$(n_{42} \times t_{42}) + (n_{64} \times t_{64}) \cong m\lambda/4 \qquad (1)$$

where n is the refractive index, t is the thickness, $\lambda$ is the vacuum wavelength of the light and m is an odd integer. The subscripts refer to oxidized region of layer 42 and to layer 64.

In operation, when incident light rays 54 interact with layers 42 and 44, a reflected wave 56 from third interface 50 lags behind a reflected wave 58 from first interface 46 by one half wave, i.e., it is completely out of phase. Since the amplitudes of reflected waves 56 and 58 are approximately equal, these two reflected waves 56,58 effectively cancel each other out. Similarly, reflected waves 60, 62 from second and fourth interfaces 48,52 effectively cancel each other out. Thus the structure has approximately zero reflection.

For a vacuum wavelength of 15500Å, $n_{42}$=1.6, $n_{64}$=3.3, and $t_{42}$=1500Å, equation (1) yields an optimum thickness $t_{64}$=447Å. However, studies have revealed the optimum thickness of $t_{64}$ to be thinner, ie., 366Å (see curve 72 in FIG. 8). The discrepancy is at least partly due to the simulated structures having different refractive indices above and below the lens 40. Slight deviations from the first order design given by equation (1) are common and due to the complex nature of multiple-layer thin film structures, especially when they are designed to replicate real structures. Therefore, equation (1) is to be used as a guideline, hence the approximation sign "≅". The expression on the right side of equation (1) preferably has a value between $\lambda/8$ and $3\lambda/8$. More generally, it preferably has a value between $(m-\frac{1}{2})\lambda/4$ and $(m+\frac{1}{2})\lambda/4$, or more preferably between $(m-\frac{1}{2})\lambda/4$ and $(m+\frac{1}{2})\lambda/4$.

In a preferred embodiment, the maximum combined thickness of layers 42, 44 and 64 will not exceed one half wave of optical path. Additionally, layers 42 and 44 would preferably have the same thickness. Finally, it is preferred that layers 42 and 44 be constructed of the same material and have the same index of refraction. It should be appreciated that layers 42 and 44 may not be of the same material or same thickness. In this event, other compensation may be desired.

Such a non-reflecting lens structure 40 may be designed for any desired total thickness of low-index material for the intra-cavity "split" block lens. It is also possible to extend the split lens concept to have more than two layers, e.g. 4, 6 or 8 layers, or even more, see FIGS. 5 and 6. It should be appreciated that there must be an even number of layers for this design to function optimally. The more layers there are, the less important is the effect of any one layer.

The various layers used in forming the various lens structures described herein are preferably semiconductor layers comprising group-III and group-V elements, for example: AlP, AlAsP, AlGaAs, AlGaAsP, AlAs, AlAsP, AlPSb, AlGaPSb, InAlAs, InAlGaAs, InAlGaAsP, AlAsSb, AlAsSbP, AlGaAsSb, InGaAlAsSbP, AlSb, AlPSb, AlGaP or InAlGaAsSb, or any combination thereof for the oxidizable layers and GaAs, AlGaAs, InAlGaAs, InAlGaP, GaAsSb, GaPSb, AlGaPSb, InGaAs, or InGaAsP, AlPSb, AlGaP or InAlGaAsSb, or any combination thereof for the non-oxidizable layers. Preferably, the layers are deposited by an epitaxial growth process such as molecular beam epitaxy, metal-organic vapor phase epitaxy, or other epitaxial processes.

A preferred method for oxidizing the oxidizable layers is to form a mesa by etching, then place the structure in a water vapor environment at a temperature greater than 300° C. The oxidation then proceeds from an outer sidewall until the oxidation conditions are removed.

The term oxidizable and oxidized are used consistently throughout the application and it should be appreciated that at least extensive parts of the oxidizable layers are oxidized during fabrication and thus produce oxidized regions or layers. An oxidizable material or layer refers to any group III–V material with sufficient aluminum (Al) content which may be oxidized significantly. For example, the initial Al content may be greater than 20% of the group III material. An oxidized semiconductor material or layer refers to any region of an Al bearing III–V material where oxygen has replaced the group V material in a proportion being greater than or equal to 90%.

A non-oxidized semiconductor material refers to any III–V material where oxygen has replaced the group V material in a proportion being less than or equal to 10%. The term non-oxidizable and non-oxidized are used consistently throughout the application and it should be appreciated that the non-oxidizable layers are not extensively oxidized during fabrication and thus produce non-oxidized layers.

Figures 5, 6:
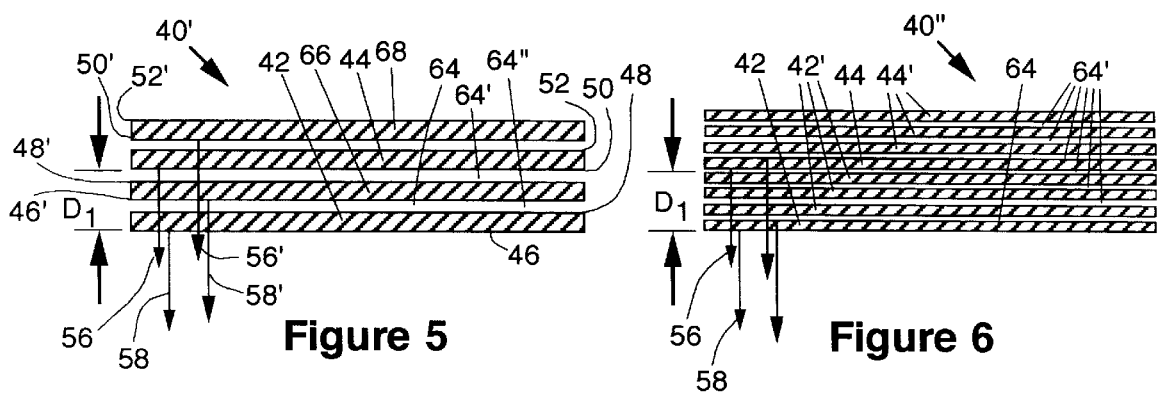
FIG. 5 is an anti-reflective lens constructed in accordance with an alternate embodiment of the invention.
FIG. 6 is an anti-reflective lens constructed in accordance with yet another alternate embodiment of the invention.

Turning now to FIG. 5, a 4X anti-reflective lens 40' constructed in accordance with an alternate embodiment of the invention is illustrated. For convenience, the notation used throughout this application is pX, where p represents the number of layers in the lens. If the lens is a more complex lens as described below, the notation pXqX may be used. In this event, p represents the number of layers in the first lens type and q represents the number of layers in the second lens type. Additionally, only the oxidized region of the lens structure is illustrated. The significant difference between lens 40 and 40' is the addition of two layers 66 and 68 and the reduction of the thicknesses of layers 42 and 44. Layer 66 is disposed between layers 42 and 44 while layer 68 is disposed above layer 44. To keep the total lens thickness at a minimum, it may be preferred to make the quarter-wave optical path separation not between adjacent layers, ie., not between layers 42 and 66 but between 42 and 44. While layers 64 are illustrated as being of the same material and thickness, it should be understood that they may be constructed from different materials and/or have different thicknesses as shown by reference numerals 64' and 64". In this embodiment, interfaces 46,48,50 and 52 have respective interfaces 46',48',50' and 52' which are disposed on layers 66 and 68. Functionally, the reflections from interfaces 46',48',50' and 52' interact correspondingly to the reflections from interfaces 46,48,50 and 52.

Turning now to FIG. 6, an 8X anti-reflective lens 40" constructed in accordance with another alternate embodiment of the invention is illustrated. For clarity, only one pair of layers 42 and 44 have been labeled. Additionally, only the oxidized portion of the lens structure is illustrated. It should be appreciated that there are four such pairs of layers in this embodiment. The main difference between lens 40" and 40 are the number of pairs of layers whose reflections interfere destructively, and their individual thicknesses. In this embodiment, there are four pairs of such layers. This may be generalized for pX layers, where p is an even number. It should be appreciated that spacer layers 64 are not taken into consideration when counting the number of pairs of layers.

Figure 7:
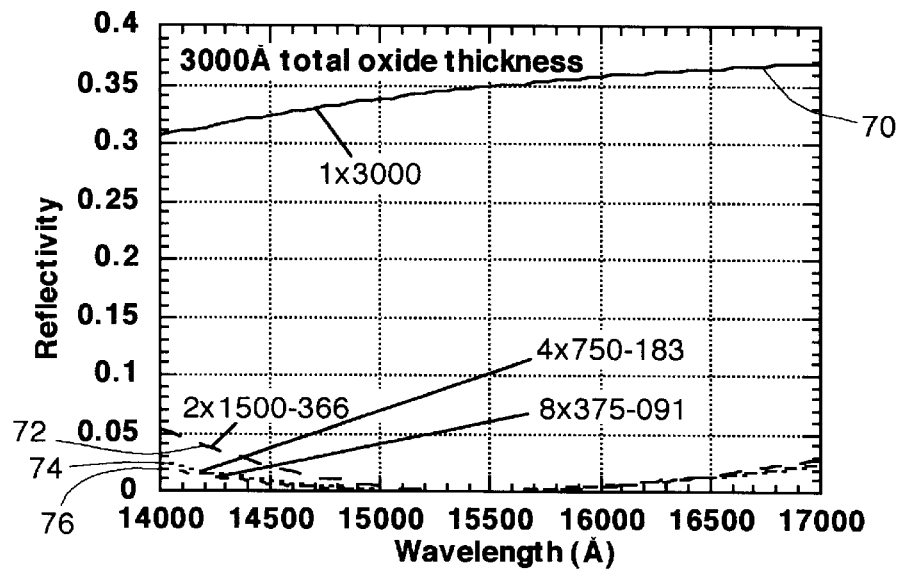
FIG. 7 is a chart of reflectivity v. wavelength for the oxidized regions of the lenses of FIGS. 1a, 4a, 5 and 6.

For initial tests of the reflectivity from the split-lens, a simpler ID thin-film structure was used. For these tests there is no aperture, just the thin film structure covering all lateral extents. The 2X structure has 1500Å thick oxidized layers and a 366Å thick spacer layer 64. The 2X structure is similar to that of FIG. 4a. The 4X and 8X structures have respective uniform oxidized layers 750Å and 375Å thick and respective uniform spacer layers 183Å and 91Å thick. These 4X and 8X structures are similar to those of FIGS. 5 and 6, respectively. The dramatic reduction in reflectivity for the split structures having 3000Å total oxide thickness is shown in FIG. 7. The single layer has a reflectivity about 35% at $\lambda$=15500Å as may be seen by curve 70. The reflectivities for 2X, 4X and 8X split structures are all negligible at the design wavelength of 1.55 $\mu$m and stay below 5% for 1500Å to either side. These reflectivites are represented by curves 72, 74 and 76, respectively.

Figure 8:
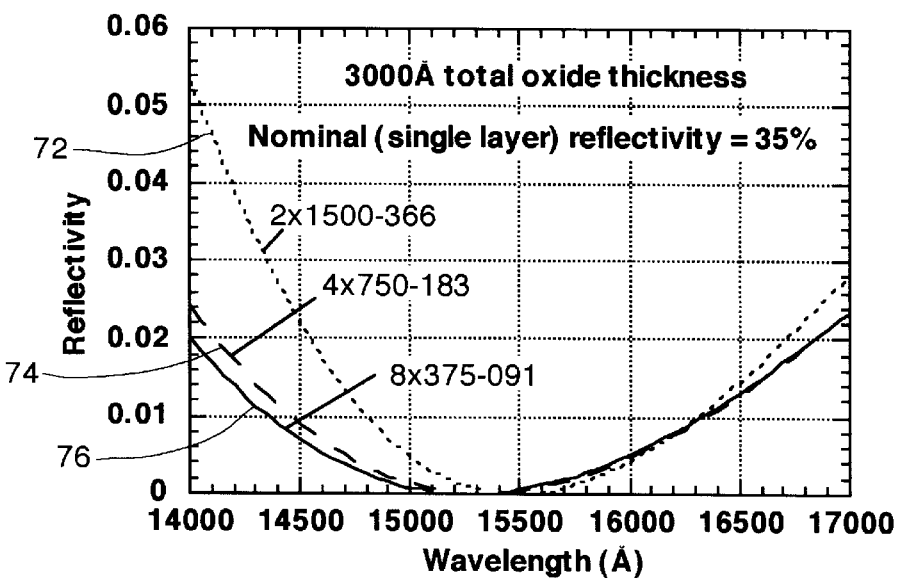
FIG. 8 is a chart of reflectivity v. wavelength for the oxidized regions of the layer structures of FIGS. 4a, 5 and 6.

It is important to note that an actual aperture lens will reflect much less than these amounts of the full beam because the highest intensity portion of the beam will simply pass through the aperture, incurring much lower reflections. The reflectivities represented in FIGS. 7 and 8 apply to the outer portion of the beam which encounters the oxide interfaces. FIG. 8 is the same data re-scaled to show the differences between the 2X, 4X and 8X split lenses. The 4X and 8X designs were not refined to produce the zero reflectivity at 1.55 $\mu$m, and are slightly shifted in wavelength. The 4X and 8X lenses show better broad-band performance than the 2X lens. This trend of better broadband performance is expected as p increases. FIG. 8 also shows that there is negligible improvement in reflection-related performance going from the 4X lens to the 8X lens.

As the number of layers, p, increases to very large numbers, the total lens thickness approaches one-half wave of optical path. Its refractive index approaches a value intermediate between the indices of the two (or more) constituent materials and is approximated by an average of the different material refractive indices weighted by their thicknesses. It is well known in thin-film optics that a half-wave of material embedded within another material produces zero reflection at the wavelength corresponding to the half-wave thickness. For a further discussion on this, see H. A. Macleod, *Thin Film Optical Filters*, Mcgraw Hill, (1989). Thus, the limiting case of the split lens concept also produces an anti-reflecting film. This is true, even for the special case of a "1X" single oxidized layer. By making a single oxidized layer one-half wave thick, or an integral multiple thereof, reflections are essentially eliminated at the design wavelength and greatly reduced at nearby wavelengths. Such oxidized layers are not reported by the prior art. Films between $3\lambda/8$ n and $5\lambda/8$ n thick, where n is the refractive index of the film and λ is the vacuum wavelength are within the scope of the invention. More generally, films between $(k-¼)λ/2n$ and $(k+¼)λ/2$ n, and preferably films between $(k-⅛k)λ/2$ n and $(k+⅛k)λ/2$ n are within the scope of the invention, where k is an integer >1. For a VCSEL the wavelength λ would correspond to the VCSEL emission wavelength.

The problem of scattering from an intra-cavity lens may also be reduced by "splitting" the total oxide thickness into multiple layers, rather than using a single layer. There are different ways to view this. It is well known that the smaller a scattering surface, the smaller the amount of scattered light. For spherical particles much smaller than the wavelength, the scattering is mostly Rayleigh scattering which is inversely proportional to the fourth power of the particle radius. The scattering surfaces for intra-cavity VCSEL lenses considered here have sizes on the order of the light wavelength and are not spherical. The scattering behavior in this size regime, even for idealized shapes, is complex. The scattering is expected to have a power dependence between the first and fourth powers of the oxidized layer thickness. If a single scattering surface is divided up into two smaller separate surfaces, each half as large as the original, the scattered light from each surface is reduced by a factor more than two. Thus, the total scattering is reduced. By the same reasoning, dividing the scattering surfaces into more than two smaller and separated surfaces would further decrease the amount of scattering.

Figure 4B:
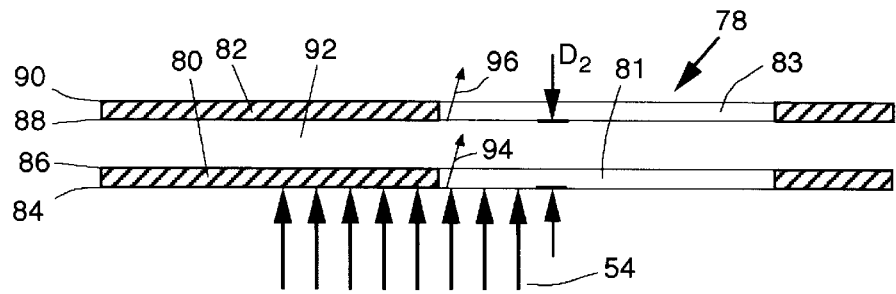
FIG. 4b is an anti-scatter lens constructed in accordance with a preferred embodiment of the invention.

Turning now to FIG. 4b, an anti-scatter lens constructed in accordance with a preferred embodiment of the invention is illustrated. Anti-scatter lens 78 comprises two layers 80,82 with oxidized regions and having non-oxidized regions 81 and 83 disposed respectively therein. Layer 80 has a first and second interface as illustrated by reference numerals 84 and 86, respectively. These interfaces correspond to the bottom and top faces of layer 80. Similarly, layer 82 has a third and fourth interface as illustrated by reference numerals 88 and 90, respectively. These interfaces correspond to the bottom and top faces of layer 82. In a preferred embodiment, layers 42,44 would have an index of refraction of n=1.6. Interfaces 84 and 88 may be separated by a distance $D_2$ which is one half wave of optical path, where $D_2$ is measured through non-oxidized region 81 and spacer layer 92. A spacer layer 92 may be provided between layers 80 and 82. This spacer layer 92 will have an index of refraction greater than either layers 80 or 82 and could have an index of refraction of n=2.9, for example. In a preferred embodiment, the maximum combined thickness of layers 80, 82 and 92 will not exceed one wave of optical path. Additionally, layers 80 and 82 would preferably have the same thickness. Finally, it is preferred that layers 80 and 82 be constructed of the same material and have the same index of refraction. It should be appreciated that layers 80 and 82 may not be of the same material or same thickness. In this event, other compensation may be required.

Generally, the optical path of $D_2$ may be expressed as preferably between $(m-¼)λ/2$ n and $(m+¼)λ/2n$, or more, preferably between $(m-⅛m))λ/2$ n and $(m+⅛m))λ/2$ n.

In operation, when incident light rays 54 interact with oxidized regions 80 and 82, a first scattering wave 94 from first interface 84 lags behind a second scattering wave 96 from third interface 88 by one half wave in the non-oxidized aperture region of lens 78, i.e., the two waves are out of phase. Since the amplitudes of scattered waves are nominally equal, the two scattered waves 94,96 interfere destructively and suppress scattering. This destructive interference is difficult to simulate directly, however a simulation to be presented later provides indirect evidence of its effectiveness. Please refer to the descriptive matter for FIGS. 18 and 19 for a further discussion on this matter.

In a similar fashion to lens 40' and 40", lens 78 may be constructed to be a 4X or 8X lens structure. To avoid repetition, these structures are not illustrated.

Figure 4C:
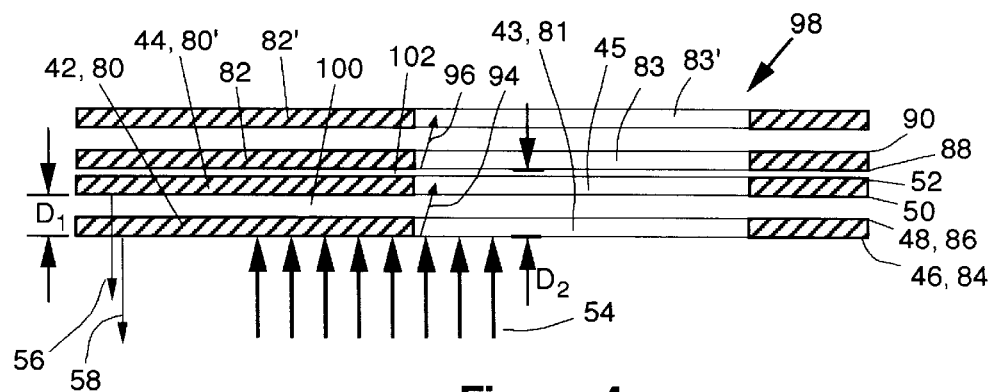
FIG. 4c is a combination anti-reflective and anti-scatter lens constructed in accordance with a preferred embodiment of the invention.

Turning now to FIG. 4c, a combination anti-reflective and anti-scatter lens 98 constructed in accordance with a preferred embodiment of the invention is illustrated. As may be seen layers 42 and 80 are the same layer in this embodiment. Thus, interfaces 46 and 84 are the same interface. Similarly, interface 48 and 86 are the same. Lens 98 functions similarly to lens 40 and 78 as described above, except that the characteristics are combined in one lens structure. As illustrated, this is a 2x2x lens. It should be appreciated that a 4X4X lens or an 8X8X may be created by following the example of FIGS. 5 and 6. In order to provide a balanced anti-scattering scheme, layer 44 is also referred to as 80' and has a corresponding layer 82' which function as layers 80,82 as described in FIG. 4b.

Figure 9A:
FIG. 9a and 9b are alternate embodiments of the anti-reflective lens of FIG. 4a and 5.
Figure 9B:
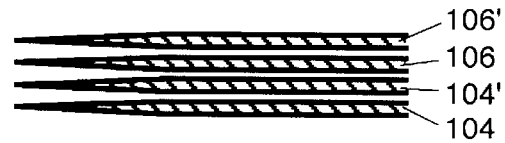

While the above discussion has focused on abrupt or block interfaces for the respective lens structures, it should be appreciated that a tapered lens structure may be utilized. As discussed above, these tapered lens structures are not as efficient as the block lens structures as discussed with reference to FIG. 3. A 2X tapered lens is illustrated in FIG. 9a as having layers 104 and 106. It should be appreciated that layers 104 and 106 may correspond to layers 42,44 or layers 80,82. In a similar fashion a 4X lens is illustrated in FIG. 9b. This lens has two sets of layers 104,106 and 104',106'. Layers 104 and 106 may correspond to layers 42 and 44 or layers 80 and 82 or layers 42, 80 and 82. Similarly, layers 104',106' may correspond to layers 66 and 68 or layers 80 and 82 or layers 44,80' and 82'.

Figure 10:
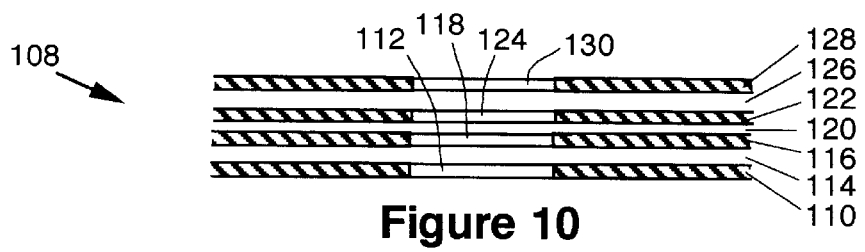
FIG. 10 is a scaled cross section for a 2X2X anti-reflective and anti-scatter lens which is illustrated in FIG. 4c.

FIG. 10 illustrates details of a specific 2X2X lens structure 108. In this embodiment, a first oxidized layer 110 is provided with a non-oxidized region 112. Layer 110 has a thickness of 750Å and the oxidized portion has an index of refraction of n=1.6. Non-oxidized region 112 has an index of refraction of n=2.9. Next, a spacer layer 114 is disposed above layer 110. Spacer layer 114 has a thickness of 950Å and an index of refraction of n=3.3. Next, a second oxidized layer 116, is disposed above layer 114. A non-oxidized region 118 is disposed in layer 116 and laterally in alignment with non-oxidized region 112. Layer 116 has a thickness of 750Å and the oxidized portion has an index of refraction of n=1.6. Non-oxidized region 118 has an index of refraction of n=2.9. A spacer layer 120 is disposed above layer 116. Spacer layer 120 has a thickness of 251Å and an index of refraction of n=3.3. Next, a third oxidized layer 122, is disposed above layer 120. A non-oxidized region 124 is disposed in layer 122 and laterally in alignment with non-oxidized regions 112,118. Layer 122 has a thickness of 750Å and the oxidized portion has an index of refraction of n=1.6. Non-oxidized region 124 has an index of refraction of n=2.9. A spacer layer 126 is disposed above layer 122. Spacer layer 126 has a thickness of 950Å and an index of refraction of n=3.3. Finally, a fourth oxidized layer 128, is disposed above layer 126. A non-oxidized region 130 is disposed in layer 128 and laterally in alignment with non-oxidized regions 112, 118 and 124. Layer 128 has a thickness of 750Å and the oxidized portion has an index of refraction of n=1.6. Non-oxidized region 124 has an index of refraction of n=2.9. In a preferred embodiment, non-oxidized regions 112,118, 124 and 130 would have a radius between 0.5 μm and 1.0 μm. It should be appreciated that non-oxidized regions 112,118, 124 and 130 form an aperture. This structure has been designed for use in a VCSEL having an emission wavelength of 1.55.

Figure 11:
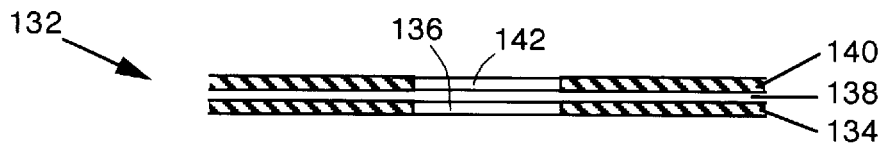

Turning now to FIG. 11, a detailed structure for a 2X anti-refractive lens 132 is provided. In this embodiment, a first oxidized layer 134 is provided with a non-oxidized region 136. Layer 134 has a thickness of 1500Å and the oxidized portion has an index of refraction of n=1.6. Non-oxidized region 136 has an index of refraction of n=2.83. Next, a spacer layer 138 is disposed above layer 134. Spacer layer 138 has a thickness of 366Å and an index of refraction of n=3.3 or n=2.92. Next, a second oxidized layer 140, is disposed above layer 138. A non-oxidized region 142 is disposed in layer 140 and laterally in alignment with non-oxidized region 136. Layer 140 has a thickness of 1500Å and the oxidized portion has an index of refraction of n=1.6. Non-oxidized region 142 has an index of refraction of n=2.83. In a preferred embodiment, the radius of non-oxidized region is 0.75 μm. This structure has been designed for use in a VCSEL having an emission wavelength of 1.55.

Figure 12:
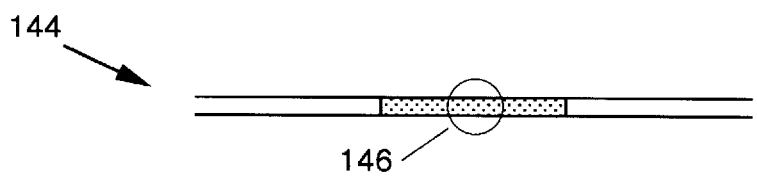
FIG. 12 is a cross section of a nominal gain region constructed in accordance with a preferred embodiment of the invention.

FIG. 12 is a cross section of a nominal gain region 144 constructed in accordance with a preferred embodiment of the invention. Gain region 144 is designed to allow for 1% gain per pass. This is accomplished by adjusting the thickness, given the gain material's complex index of refraction. In a preferred embodiment, the complex index of refraction will be n=3.5+10.0075. As may be seen, gain region 144 has a central portion 146. Spontaneous emission in the form of a spherical wave emits from the center of the central portion 146 to initiate the lasing process. In a typical embodiment, the central portion 146 has a radius which is 1.0 μm larger than the nonoxidized regions in any lens structure described above. For example, non-oxidized regions 112, 118, 124 and 130 would have a radius which is at least 1.0 μm smaller than the central portion 146. The 1.0 μm larger radius corresponds to the diffusion distance of the electrons and holes responsible for the optical gain in gain region 144.

Figure 13:
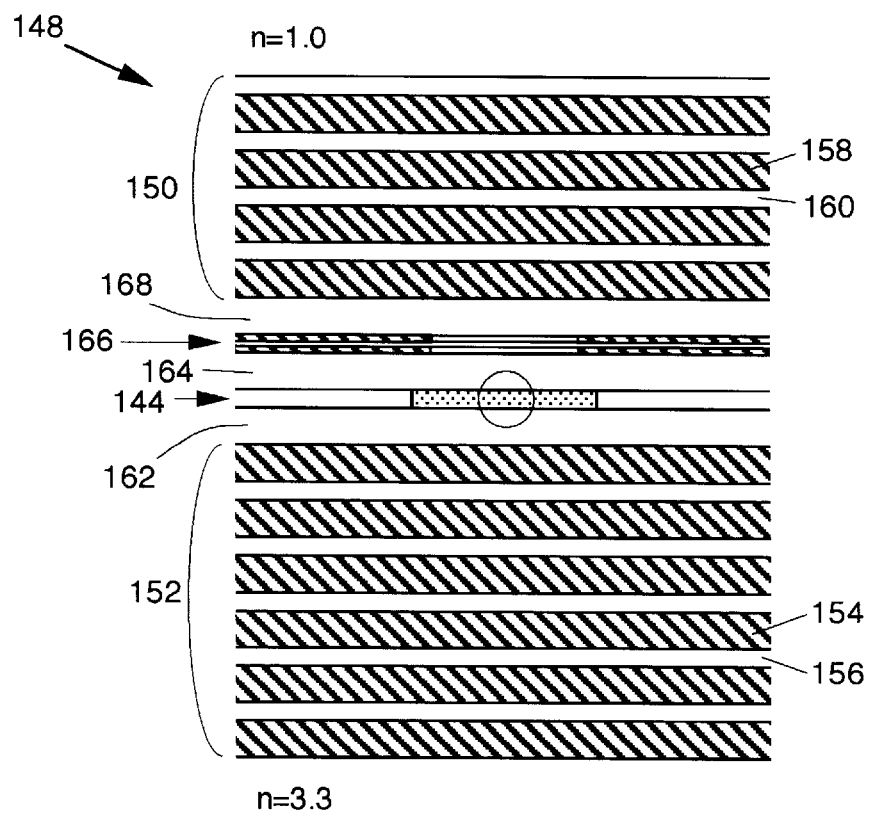
FIG. 13 is a cross section of an optical cavity employing any of the lenses illustrated in FIGS. 1a, 1b, 2a, 2b 2c, 4a, 4b, 4c, 5, 6, 9a, 9b, 10 and 11; as well as the gain region illustrated in FIG. 12.

Turning now to FIG. 13, a cross section of an optical cavity 148 employing any of the lenses illustrated in FIGS. 1a, 1b, 2a, 2b, 2c, 4a, 4b, 4c, 5, 6, 9a, 9b, 10 and 11; as well as the gain region illustrated in FIG. 12 is illustrated. Optical cavity 148 comprises a top and bottom DBR mirrors 150, 152, respectively. Bottom DBR mirror 152 comprises pairs of oxidized 154 and non-oxidized layers 156. For clarity, only one pair of layers have been provided with reference numerals. In a preferred embodiment, oxidized layer 154 would be 2422Å thick and have an index of refraction of n=1.6. Similarly, non-oxidized layer 156 be 1174Å thick and have an index of refraction of n=3.3. Top mirror 150 is constructed in a similar fashion and has layers 158 and 160 which correspond to layers 154, 156 respectively. It should be appreciated that mirrors 150, 152 may be constructed from other materials which are not oxidized. For example, layers 154, 156 may comprise high-index layers 104 and low-index layers, respectively or may have different dielectric constants.

Disposed above mirror 152 is a spacer 162. In a preferred embodiment, spacer 162 will be 1761Å thick and have an index of refraction of n=3.3. It should be appreciated that spacer 162 functions to separate mirror 152 from gain region 144. For a more complete description of gain region 144 see the discussion of FIG. 12, above. In a similar fashion, spacer 164 is disposed above gain region 144. In a preferred embodiment, spacer 164 will be 2642Å thick and have an index of refraction of n=3.3. Spacer 164 separates gain region 144 from lens 166, discussed below. Finally, a spacer 168 is provided between lens 166 and top mirror 150. In a preferred embodiment, spacer 168 will be 3228Å thick and have an index of refraction of n=3.3. It should be appreciated that the thicknesses and indices of refraction are provided for generating an emission having a vacuum wavelength of 1.55 μm. Therefore, it should be appreciated that the thicknesses and indices of refraction may change for other wavelengths or other lens structures.

Turning now to lens 166, FIG. 13 illustrates a 2X lens similar to that of FIG. 4a. It should be appreciated that any lens structure such as those illustrated in FIGS. 1a, 1b, 2a, 2b, 2c, 4a, 4b, 4c, 5, 6, 9a, 9b, 10 or 11 may be utilized in place of lens 166. Additionally, any lens which employs the teaching provided for these lenses may also be utilized. Of course, there would need to be appropriate adjustment to thicknessess of layers 162, 164, and 168 to take into account different lens structures.

Twenty-five different lens situations were evaluated with the lenses having different total thicknesses, different locations in the cavity, and different structural characteristics. The lens characteristics are listed below in Table 1. The nominal optical wavelength for all cases is 1.55 μm. The lens numbers in Table 1 correspond to the lens number references on FIGS. 14 though 17.

TABLE 1

| Lens # | Layers (Å) | Center Location | Radius (μm) | Comments |
|---|---|---|---|---|
| 1 | 1500/366/1500 | Antinode | 0.75 | 2X split lens |
| 2 | 1500/366/1500 | Antinode | 0.65 | |
| 3 | 1500/366/1500 | Antinode | 0.85 | |
| 4 | 1500/366/1500 | Antinode | 0.75 | start 1% gain, 7-per. mirrors |
| 5 | 1500/366/1500 | Antinode | 0.85 | |
| 6 | 1500/366/1500 | Antinode | 1.00 | |
| 7 | 3000 | Antinode | 0.85 | standard "block" lens |
| 8 | 3000 | Node | 0.85 | |
| 9 | 750 × 4 | Antinode | 0.85 | anti reflective, anti-scatter lens |
| 10 | 750 × 4 | Node | 0.85 | |
| 11 | 750 × 4 | Mid | 0.85 | midway between node/antinode |
| 12 | 1500/366/1500 | Mid | 0.85 | |
| 13 | 3000 | Mid | 0.85 | |
| 14 | 1370 | Node | 0.85 | one-quarter-wave thick |
| 15 | 685 | Node | 0.85 | one-eighth-wave thick |
| 16 | 3000 | Node | 0.75 | |
| 17 | 750 × 4 | Antinode | 0.75 | |
| 18 | 3000 | Node | 0.65 | |
| 19 | 750 × 4 | Antinode | 0.65 | |
| 20 | 1370 | Node | 0.65 | |
| 21 | 3000 | Node | 0.50 | |
| 22 | 750 × 4 | Antinode | 0.50 | |
| 23 | 1370 | Node | 0.50 | |
| 24 | 3000 Tapered | Node | 0.65 | radius at mid-taper location |
| 25 | 685 × 2 | 2 Nodes | 0.65 | centers one-half-wave apart |

In addition to the time evolution of the electric field amplitude, the following data were plotted for the latest time of the simulation, e.g. ~1 ps: optical frequency spectrum, lateral intensity profile, and longitudinal intensity profile (standing wave profile). The plots presented in this application concentrate on properties having the highest interest.

Figure 14:
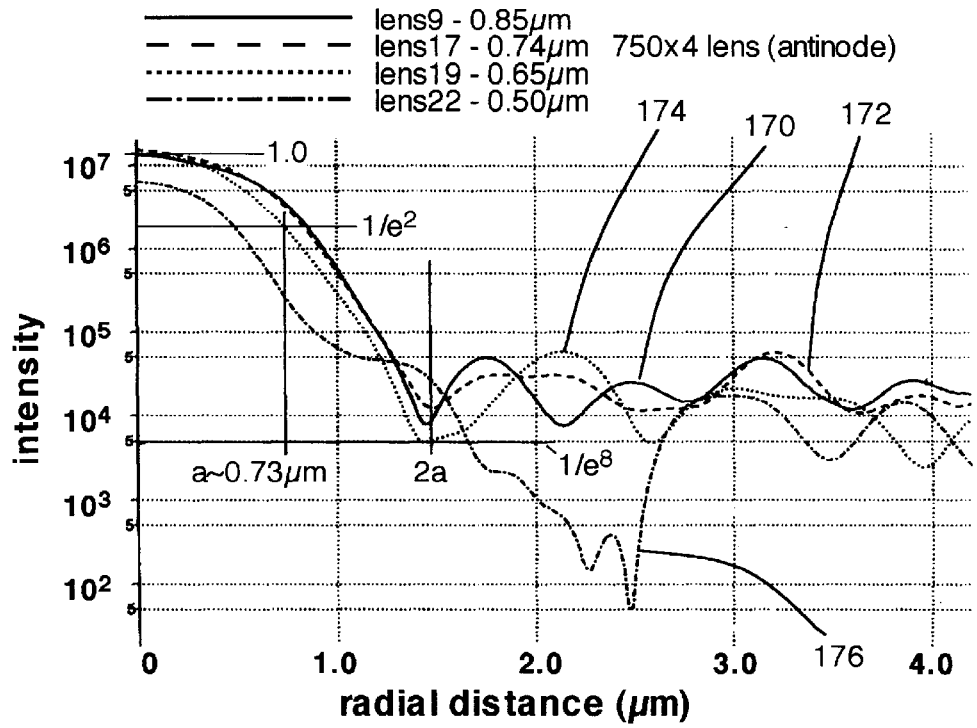
FIG. 14 illustrates intensity profiles for the lens structure of FIG. 10 when the radius is varied in this lens structure.
Figure 16:
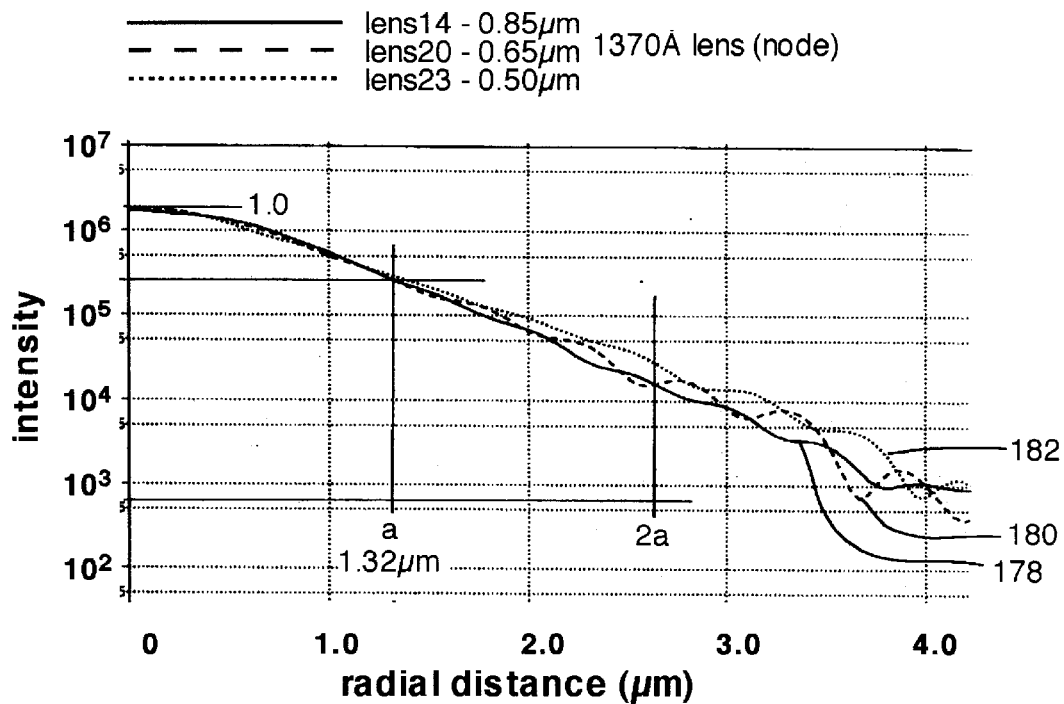
FIG. 16 illustrates intensity profiles for a quarter-wave thick lens structure centered at a node of the standing waves when the radius is varied in this lens structure.

Turning now to FIG. 14, the intensity profiles for lenses 9, 17, 19 and 22 are illustrated. These lenses are all the same—layered 2X2X anti-reflecting anti-scattering lens centered at an antinode, and having different radii. In a similar fashion, FIG. 16 illustrates the intensity profiles for lenses 14, 20 and 23. These lens are all a "1X" simple lens, one-quarter wave (1370Å) thick centered at a node and having several radii. For clarity, the curves associated with lenses 14, 20 and 23 are numbered 178, 180 and 182, respectively. For reference, lines corresponding to reductions of $1/e^2$ and $1/e^8$ are drawn, as are the radii a (defined by $1/e^2$) and 2a. At the 2a radius, the beam in the 750×4 lens cavity is near the $1/e^8$ level, as it should be for a gaussian beam. The beam in the 1370Å lens cavity, at the 2a radius, has an intensity more than an order of magnitude above its "gaussian beam" level. For a 0.75 μm lens radius, the $1/e^2$ beam radius is 0.73 μm for the 750×4 lens cavity and is 1.32 μm for the 1370Å lens cavity. For clarity, the curves associated with lenses 9, 17, 19 and 22 are numbered 170, 172, 174, and 176, respectively.

Figure 15:
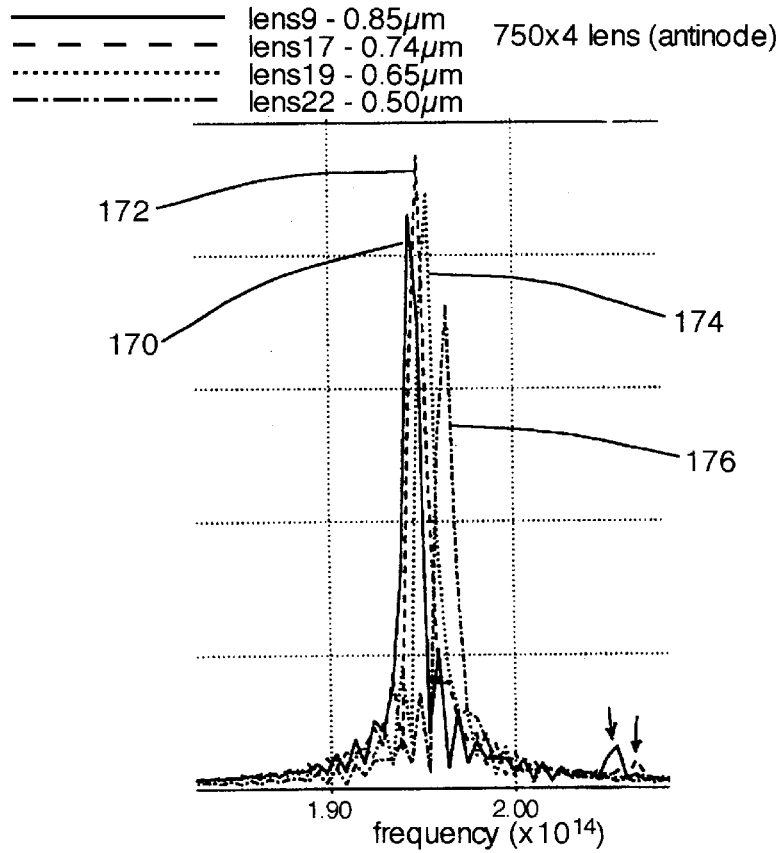
FIG. 15 illustrates the frequency spectra for the lens structure of FIG. 10 when the radius is varied in this lens structure.
Figure 17:
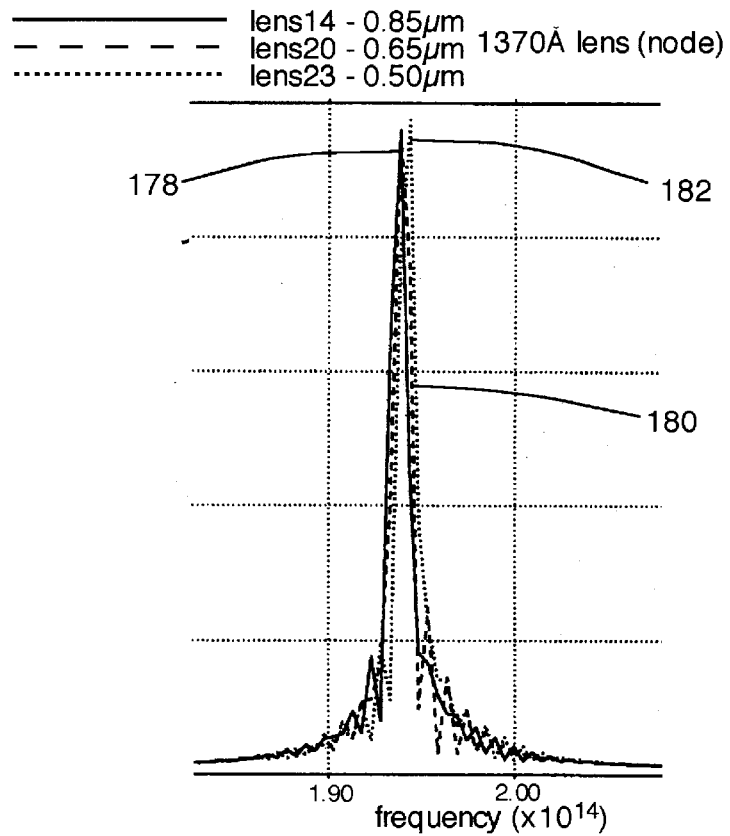
FIG. 17 illustrates the frequency spectra for the lens structures of FIG. 16.

FIGS. 15 and 17 show the frequency spectra for the same 750×4 (2x2x) and 1370Å lenses discussed above. Lens 19 produces an emission wavelength about 7.7 mn shorter than lens 9. The cavity with lens 22 produced a ~15 nm wavelength shift compared to lens 9, but the lens 22 cavity did not exhibit optical gain. It may require a thicker lens with more refracting power to produce well-defined laser modes at such small radii (0.5 μm for light with a vacuum wavelength of 1.55 μm). The dependence of emission wavelength on lens diameter may be interpreted as waveguide dispersion or as overlap of the electric field with the low-index lens material. The implication is that a modest degree of wavelength control can be obtained with the 750×4 lens. This discovery, described in U.S. patent application No. 08/547,165, now abandoned, by the present inventor, is supported by the publication by Huffaker and Deppe [IEEE Photonics Technology Letters, vol. 8, pp. 858–860, July 1996] in which they report ~3.4 nm wavelength control in 960 nm emitting VCSELs via differing lens sizes.

The spectra from the cavities having the 750×4 lenses 9 and 17 also exhibit what appear to be higher-order transverse modes. They occur at much higher frequencies (shorter wavelengths) than the fundamental modes and are indicated by arrows. They appear to represent real modes since higher-order transverse modes occur at shorter wavelengths. Also, a larger shift occurs for the smaller-diameter lens, as expected. The modal wavelength shifts are larger than seen in typical VCSELs, however this is not surprising since the lens thickness is much greater than for reported VCSELs and the optical mode sizes are very small. Since the wavelength shifts are about 70–80 nm, in a real VCSEL with a finite bandwidth of the gain region, these modes would probably experience no net gain. This simulation does provide evidence that VCSELs having such lenses would probably lase only in the fundamental transverse mode.

Figure 18A:
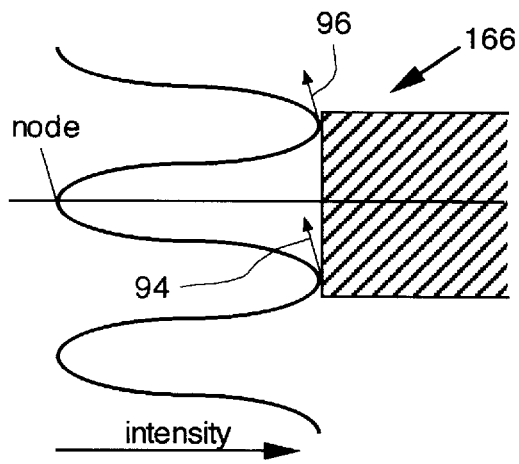
FIGS. 18a and 18b illustrate a lens structure disposed at a node and antinode, respectively.
Figure 18B:
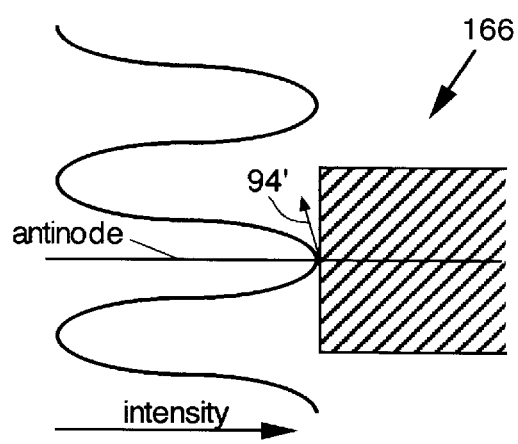
Figure 19A:
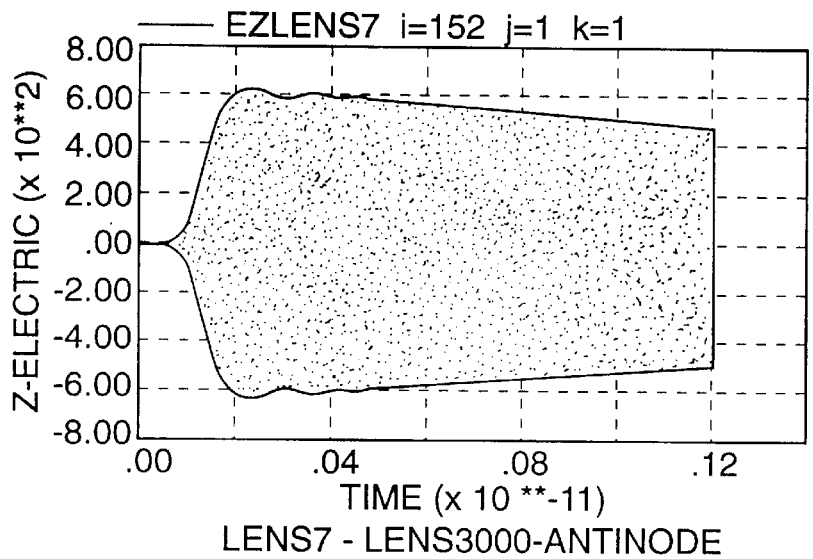
FIGS. 19a, 19b and 19c, illustrate the electric field amplitude of a select lens located at the antinode, node and mid locations, respectively.
Figure 19B:
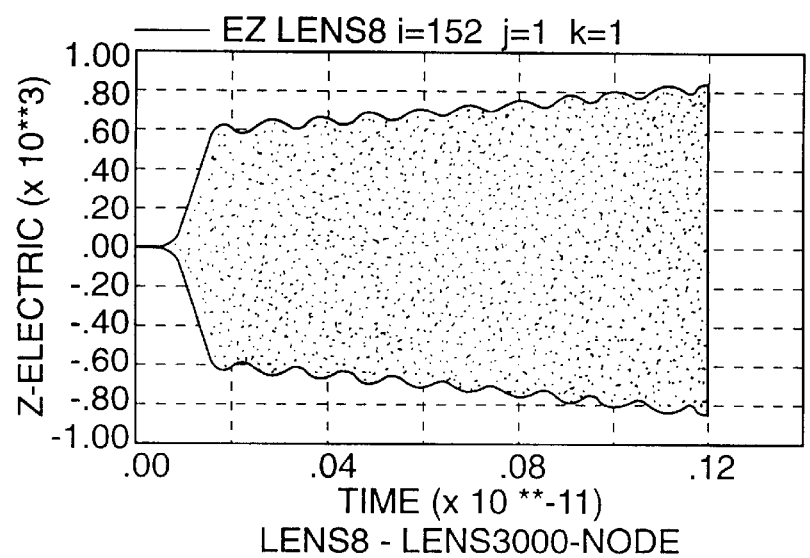
Figure 19C:
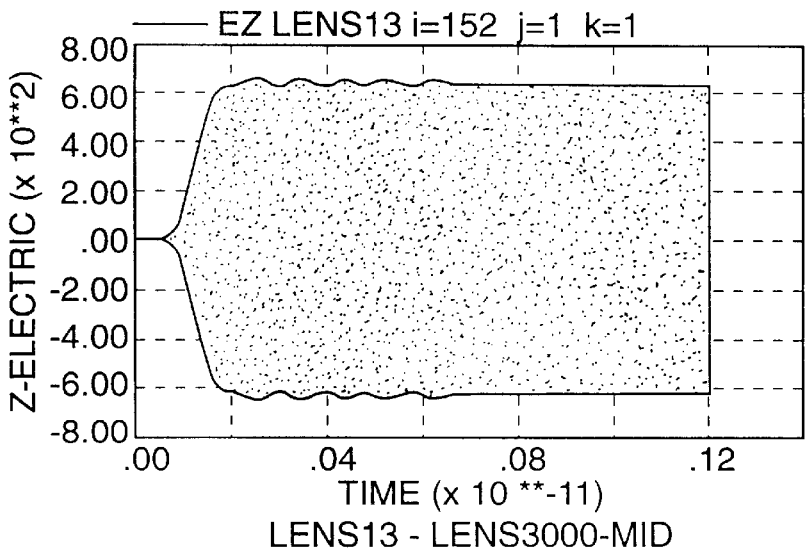

Lenses 7, 8, and 13 (Table 1) represent the same 3000Å thick block lens at 3 different locations of the lens center: at an antinode, at a node, and midway between these locations. FIGS. 18a and 18b, illustrate the lens at a node and antinode, respectively. These time evolutions of the electric field amplitudes are presented in FIG. 19a, 19b and 19c for the respective positions. The difference is striking. The antinode position yields net loss, as illustrated in FIG. 19a, the node position yields large net gain (illustrated in FIG. 19b), and the mid position about breaks even as shown in FIG. 19c. Most oxide VCSELs employ a quarter-wave-thick lens centered at the mid position. Therefore, there may be an advantage gained by the proper positioning of the lens in a VCSEL.

The 750×4 lens showed no strong dependence on location. The half-wave periodicity of the 750×4 lens is believed to be responsible for this non-dependence. It showed net gain for all three locations and actually performed best when centered on an antinode, rather than on a node as for the 3000Å block lens.

An interesting aspect of the 3000Å block lens is that it performs very well when in the node position. It is helpful to look at the standing wave intensity pattern relative to the lens to gain insight as to why this might be. FIGS. 18a and 18b show lens 166 in the node and antinode locations, also showing the standing waves. Scattering may be expected to occur mostly where the intensity is maximum, i.e., at the peaks of the standing waves. At first glance then, it might seem that the node location should produce more scattering since it overlaps with two intensity peaks, while the antinode location overlaps with only one peak. However, remembering the principle of the anti-scattering lens, (see description of FIG. 4b), the node location naturally accomplishes the anti-scattering condition. Since the node location mainly produces two scattered waves which are exactly one-half-wave apart, the two waves should interfere destructively. This behavior is thus counter-intuitive since the overlap factor with the standing wave intensity pattern of the lens 166 in the node location is higher than it is in the antinode location. It should be appreciated that several of the lenses described above are preferably placed at or near the antinode while several of the lenses are preferably placed at the node. In either case, it is desired to have lens 166 centered within one sixteenth of a vacuum wavelength of optical path in either direction of the node or antinode. For light emitting devices such as VCSELs, the wavelength is the emission wavelength.

Figure 20:
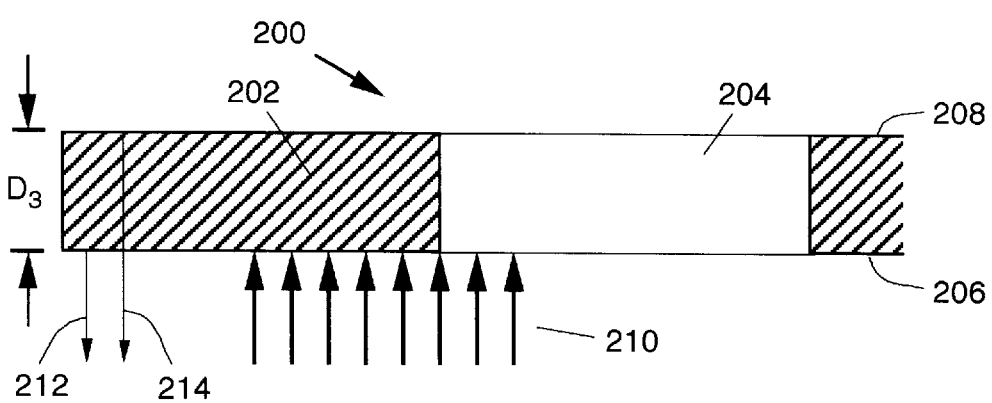
FIG. 20 is a cross section of yet another embodiment of the inventive lens structure constructed in accordance with an alternate embodiment of the invention.

Turning now to FIG. 20, there is shown lens 200 comprising a single layer 202 which is oxidized in some regions and is nonoxidized in region 204. Lens 200 has interfaces 206 and 208 at the bottom and top of layer 202, respectively. By careful choice of the lens thickness, $D_3$, lens 200 may be anti-reflecting. In particular, $D_3$ is preferably one-half wave thick as measured through the oxidized region of layer 202. When light rays 210 are incident upon oxidized region of layer 202, reflections 212 and 214 occur at interfaces 206 and 208, respectively. Reflection 212 experiences a nominal 0° phase change on reflection from interface 206, while reflection 214 incurs a 180° phase change at interface 208. For the half-wave thickness of lens 200, the phase delay of reflection 214 behind reflection 212 is thus one full wave for the double pass through the lens, plus the 180° phase change on reflection. The full-wave delay leaves the phase difference unchanged. Thus the overall phase difference between reflections 212 and 214 is 180°, i.e. they are completely out of phase. In the preferred case when the refractive index of the media below and above lens 200 are approximately equal, the amplitudes of reflections 212 and 214 are also approximately equal. Thus, reflections 212 and 214 destructively interfere with approximately equal amplitudes and therefore result in approximately zero net reflection. For slight deviations from the half-wave thickness, the reflection is also about zero. When $D_3$ is any integral multiple of one-half wave, the round-trip phase delay is always an integral multiple of a full wave and therefore does not affect the phase delay between the reflections. Therefore, any multiple of one-half wave thickness for $D_3$, (or close approximation thereof), also produces the condition near-zero reflectivity. For all the lenses, reflections are very small in the non-oxidized regions since the refractive index difference is small.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed:

1. A lens comprising at least a first, second and third adjacent lens layers arranged vertically, said first and third lens layers being oxidized in first and third oxidized regions adjacent to first and third non-oxidized regions, said second layer disposed between said first and third layers and comprising a non-oxidized semiconductor material, said first and third non-oxidized regions comprising a semiconductor material, each of said oxidized regions having an aluminum content greater than 20%; and means for reducing reflections from said first and third oxidized regions.

2. The lens recited in claim 1, wherein centers of said first and third layers are separated vertically by less than 2000Å.

3. The lens recited in claim 1, acting upon a light beam having substantial intensity and a vacuum wavelength, wherein an optical path between centers of said first and third adjacent layers, as measured vertically through said first and third oxidized regions, is approximately one-quarter of said vacuum wavelength.

4. The lens recited in claim 1, acting upon a light beam having substantial intensity and a vacuum wavelength, wherein an optical path between centers of said first and third adjacent layers, as measured vertically through said first and third oxidized regions, is between one-eighth and three-eighths of said vacuum wavelength.

5. The lens recited in claim 1, acting upon a light beam having substantial intensity and a vacuum wavelength, wherein an optical path between centers of said first and third adjacent layers, as measured vertically through said first and third oxidized regions, is between five-eighths and seven-eighths of said vacuum wavelength.

6. The lens recited in claim 1, further comprising top and bottom mirrors having said lens layers disposed therebetween, an optical source disposed between said mirrors, said mirrors forming a resonator having a standing wave pattern disposed therein and having optical nodes and antinodes, wherein said second lens layer is disposed about said optical node.

7. The lens recited in claim 6, wherein an optical path from a center of said second layer is $\leq \frac{1}{16}$ of a vacuum wavelength from said node.

8. The lens recited in claim 1, acting upon a light beam having substantial intensity and a vacuum wavelength, wherein an optical path between centers of said first and third adjacent layers, as measured vertically through said first and third oxidized regions, is less than one-quarter of said vacuum wavelength.

9. The lens recited in claim 1, acting upon a light beam having substantial intensity and a vacuum wavelength, wherein an optical path between centers of said first and third adjacent layers, as measured vertically through said first and third oxidized regions, is less than one-eighth of said vacuum wavelength.

10. The lens recited in claim 1, further comprising:
a first conductive layer having a first conductivity type;
a light emitting material, said light emitting material disposed above said first conductive layer and in electrical communication therewith;
a second conductive layer having a second conductivity type, said second conductive layer being disposed above said first conductive layer and in electrical communication therewith;
electrical communication means for providing electrical communication to said light emitting material; and
wherein said first lens layer is proximal to said light emitting material.

11. The light emitting device recited in claim 10, further comprising a first mirror disposed below said light emitting material and a second mirror disposed above said light emitting material.

12. The lens recited in claim 1, further comprising top and bottom mirrors having said lens layers disposed therebetween, an optical source disposed between said mirrors, said mirrors forming a resonator having a standing wave pattern disposed therein and having optical nodes and antinodes, wherein said second lens layer is disposed about said optical antinode.

13. The lens recited in claim 12, wherein an optical path from a center of said second layer is $\leq \frac{1}{16}$ of a vacuum wavelength from said antinode.

14. A lens comprising a plurality of oxidized lens layers, each of said oxidized lens layers comprising an oxidized region adjacent to at least one respective non-oxidized region;

said lens further comprising at least one non-oxidized lens layer between two of said oxidized lens layers;

said lens acting upon a light beam having substantial intensity and a vacuum wavelength, wherein an optical path between centers of at least two of said adjacent oxidized layers, as measured vertically through said oxidized regions, is between one-eighth and three-eighths of said vacuum wavelength.

15. The lens recited in claim 14, further comprising top and bottom mirrors having said lens layers disposed therebetween, an optical source disposed between said mirrors, said mirrors forming a resonator having a standing wave pattern disposed therein and having optical nodes and antinodes, wherein said plurality of oxidized lens layers is disposed about said optical node.

16. A lens comprising at least one lens layer, said lens layer comprising an oxidized region adjacent to a non-oxidized region;

said lens acting upon a light beam having substantial intensity and a vacuum wavelength, said lens layer having a thickness and a refractive index of said oxidized region, a multiplicative product of said thickness and said refractive index being between three-eighths and five-eighths of said vacuum wavelength.

17. The lens recited in claim 16, further comprising top and bottom mirrors having said lens layers disposed therebetween an optical source disposed between said mirrors, said mirrors forming a resonator having a standing wave pattern disposed therein and having optical nodes and antinodes, wherein said lens layer is disposed about said node.

18. A lens comprising at least a first, second and third adjacent lens layers arranged vertically, said first and third lens layers being oxidized in first and third oxidized regions adjacent to first and third non-oxidized regions, said second layer disposed between said first and third layers and comprising a non-oxidized semiconductor material, said first and third non-oxidized regions comprising a semiconductor material, each of said oxidized regions having an aluminum content greater than 20%; and means for reducing light scattering from said first and third oxidized regions.

19. The lens recited in claim 18, wherein centers of said first and third layers are separated vertically by less than 4000 Å.

20. The lens recited in claim 18, acting upon a light beam having substantial intensity and a vacuum wavelength, wherein an optical path between centers of said first and third adjacent layers, as measured vertically through said first and third nonoxidized regions, is approximately one half of said vacuum wavelength.

21. The lens recited in claim 18, acting upon a light beam having substantial intensity and a vacuum wavelength, wherein an optical path between centers of said first and third adjacent layers, as measured vertically through said first and third oxidized regions, is between seven-sixteenths and five-eighths of said vacuum wavelength.

22. The lens recited in claim 18, acting upon a light beam having substantial intensity and a vacuum wavelength, wherein an optical path between centers of said first and third adjacent layers, as measured vertically through said first and third oxidized regions, is between eleven-eighths and thirteen-eighths of said vacuum wavelength.

23. The lens recited in claim 18, further comprising:

a first conductive layer having a first conductivity type;

a light emitting material, said light emitting material disposed above said first conductive layer and in electrical communication therewith;

a second conductive layer having a second conductivity type, said second conductive layer being disposed above said light emitting material and in electrical communication therewith;

electrical communication means for providing electrical communication to said light emitting material; and wherein said first lens layer is proximal to said light emitting material.

24. The light emitting device recited in claim 23, further comprising a first mirror disposed below said light emitting material and a second mirror disposed above said light emitting material.

25. A lens comprising a plurality of oxidized lens layers, each of said oxidized lens layers comprising an oxidized region adjacent to at least one respective non-oxidized region;

said lens further comprising at least one non-oxidized lens layer between two of said adjacent oxidized lens layers;

said lens acting upon a light beam having substantial intensity and a vacuum wavelength, wherein an optical path between centers of at least two of said adjacent oxidized layers, as measured vertically through said non-oxidized regions, is between three-eighths and five-eighths of said vacuum wavelength, said positioning of said at least two of said oxidized layers for reducing scattering between said two layers.

26. A lens comprising a first pair of lens layers and a second pair of lens layers;

said first pair of lens layers having a first and second adjacent layers arranged vertically and each layer being oxidized in a first oxidized region adjacent to at least one non-oxidized region;

said second pair of lens layers having a third and fourth adjacent layers arranged vertically and each layer being oxidized in a second oxidized region adjacent to at least one non-oxidized region;

a light beam having substantial intensity and a vacuum wavelength;

wherein an optical path between the centers of said first and second adjacent layers, as measured vertically through said respective oxidized regions, is between one-eighth and three-eighths of said vacuum wavelength; and wherein an optical path between the centers of said first and third layers, as measured vertically through said respective non-oxidized regions, is between three-eighths and five-eighths of said vacuum wavelength.

27. The lens recited in claim 26, further comprising:

a first conductive layer having a first conductivity type;

a light emitting material, said light emitting material disposed above said first conductive layer and in electrical communication therewith;

a second conductive layer having a second conductivity type, said second conductive layer being disposed above said light emitting material and in electrical communication therewith;

electrical communication means for providing electrical communication to said light emitting material; and wherein said first and second pair of layers are proximal to said light emitting material.

28. The light emitting device recited in claim 27, further comprising a first mirror disposed below said light emitting material and a second mirror disposed above said light emitting material.

* * * * *